(12) United States Patent
Moon et al.

(10) Patent No.: US 8,697,328 B2
(45) Date of Patent: Apr. 15, 2014

(54) FILM TYPE PHOTODEGRADABLE TRANSFER MATERIAL

(75) Inventors: Hee Wan Moon, Gangdong-gu (KR); Byeong Il Lee, Suwon-si (KR)

(73) Assignee: Kolon Industries, Inc., Gwacheon-Si (KR)

( * ) Notice: Subject to any disclaimer, the term of this patent is extended or adjusted under 35 U.S.C. 154(b) by 126 days.

(21) Appl. No.: 12/995,137

(22) PCT Filed: May 20, 2009

(86) PCT No.: PCT/KR2009/002653
§ 371 (c)(1),
(2), (4) Date: Jan. 28, 2011

(87) PCT Pub. No.: WO2009/145520
PCT Pub. Date: Dec. 3, 2009

(65) Prior Publication Data
US 2011/0135891 A1    Jun. 9, 2011

(30) Foreign Application Priority Data
May 30, 2008 (KR) .................. 10-2008-0050596

(51) Int. Cl.
*G03F 7/004* (2006.01)
*G03C 8/00* (2006.01)
*G03F 7/00* (2006.01)

(52) U.S. Cl.
USPC ........ 430/199; 430/200; 430/201; 430/270.1; 430/252; 430/254

(58) Field of Classification Search
USPC .............. 430/199, 200, 201, 270.1, 252, 254
See application file for complete search history.

(56) References Cited

U.S. PATENT DOCUMENTS

| 4,211,560 | A  | * | 7/1980  | Taguchi et al. ............... 430/313 |
| 6,054,249 | A  | * | 4/2000  | Nagahara et al. .......... 430/273.1 |
| 6,881,529 | B2 | * | 4/2005  | Iwasaki ......................... 430/166 |
| 7,041,416 | B2 | * | 5/2006  | Wakata et al. ..................... 430/5 |
| 7,282,247 | B2 | * | 10/2007 | Keeton et al. .............. 428/32.81 |
| 7,645,562 | B2 | * | 1/2010  | Kimura et al. ............. 430/273.1 |
| 7,670,450 | B2 | * | 3/2010  | Lamansky et al. ............ 156/235 |

(Continued)

FOREIGN PATENT DOCUMENTS

| JP | 04-371957 A    | 12/1992 |
| JP | 06-242611 A    | 9/1994  |
| KR | 10-2007-0102018 A | 10/2007 |
| WO | 2007/125992 A1 | 11/2007 |

OTHER PUBLICATIONS

Machine translation of JP 06-242611 (no date).*

*Primary Examiner* — Amanda C. Walke
(74) *Attorney, Agent, or Firm* — Sughrue Mion, PLLC

(57) ABSTRACT

Disclosed herein is a film-type photodegradable transfer material, comprising: a support film; a resin protection layer; a photodegradable photoresist layer; and a cover film, wherein the resin protection layer has an adhesion force of 0.05 $kg_f$ or less. When the film-type photodegradable transfer material is used to form a fine circuit pattern, such as a printed circuit board or the like, the resolution of the pattern can be increased by minimizing the distance between a mask and a photosensitive resin layer at the time of exposure, and work can be performed in the form of a sheet or a roll to roll process can be applied to the work even when the support film has been removed before an exposure process.

22 Claims, 1 Drawing Sheet

(56) References Cited

U.S. PATENT DOCUMENTS

| | | | |
|---|---|---|---|
| 7,687,224 B2 * | 3/2010 | Kimura et al. | 430/273.1 |
| 8,003,292 B2 * | 8/2011 | Kroeninger et al. | 430/258 |
| 2009/0274900 A1 * | 11/2009 | Kim et al. | 428/336 |

* cited by examiner

FILM TYPE PHOTODEGRADABLE TRANSFER MATERIAL

CROSS REFERENCE TO RELATED APPLICATIONS

This application is a National Stage of International Application No. PCT/KR2009/002653, filed on May 20, 2009, which claims priority from Korean Patent Application No. 10-2008-0050596 filed on May 30, 2008, the contents of all of which are incorporated herein by reference in their entirety.

TECHNICAL FIELD

The present invention relates to a film-type photodegradable transfer material.

BACKGROUND ART

Generally, as a film-type photosensitive transfer material, a dry film type photosensitive transfer material (hereinafter, referred to as "a dry film photoresist") is typically used.

Generally, the dry film photoresist, which is typically used to form printed wiring boards, printed circuit boards and IC packages, includes three layers of a support film, a photoresist layer and a cover film.

The dry film photoresist includes a negativetype dry film photoresist and a positive-type dry film photoresist according to the difference in optical mechanism therebetween. In the case of the negativetype dry film photoresist, a photocrosslinking reaction is conducted at its light exposed site, and its non-exposed site is washed out with alkali and thus a resist pattern is formed thereon. In the case of the positive-type dry film photoresist, a photodegradation reaction is conducted at its light exposed site and thus developed with alkali, and a resist pattern is formed on its non-exposed site.

In the case of the positive-type dry film photoresist, a photoresist layer includes a photosensitive compound reacted by light and an alkali-soluble, and has predetermined adhesivity because a photoresist-making solution is formed into a film.

In the dry film photoresist, a support film serves to support a photoresist layer, and enables a photoresist layer having adhesivity to be easily treated at the time of exposure of the photoresist layer. Further, in the dry film photoresist, a cover film is formed on the photoresist layer on which the support film is not formed, and serves to prevent the photoresist layer from being damaged.

According to a method of forming a pattern using a dry film photoresist, for example, a positive-type dry film photoresist, when this method is applied to a printed circuit board, first, a cover film is separated from a positive-type dry film photoresist, and then the positive-type dry film photoresist is layered on a copper clad laminate (CCL), and then the CCL layered with the cover film is exposed by irradiating it with UV using a mask having a desired pattern, and then the exposed CCL is developed by washing it with a proper solvent. Generally, exposure is conducted with a support film adhered on a photoresist layer. Therefore, in this case, since the photoresist layer and the mask are spaced apart from each other by the thickness of the support film, there is a problem of decreasing resolution.

With the densification of a printed circuit board and the advancement of semiconductor packaging technology, circuit line width is densified, and thus a film-type photodegradable transfer material having high resolution, which can be applied to such a fine printed circuit board, is keenly required.

Meanwhile, in the case of some positive-type dry film photoresists, since a solvent for forming a film remains in a phtotoresist layer, the positive-type dry film photoresist is exposed after a support film is separated therefrom. However, in this case, there is a problem in that a mask and a photoresist layer adhere to each other at the time of contact-type exposure.

Further, generally, in terms of photosensitivity, since it is advantageous to prevent a dry film photoresist from being exposed to air when a photoreaction is conducted in a photoresist layer, the dry film photoresist is exposed after a support film is separated therefrom in consideration of resolution. However, in this case, there is a problem in that photosensitivity is deteriorated.

DISCLOSURE

Technical Problem

Accordingly, the present invention has been made to solve the abovementioned problems, and the present invention intends to provide a film-type photodegradable transfer material, by which exposure can be conducted after the removal of a support film.

The present invention also intends to provide a film-type photodegradable transfer material, which can increase resolution by minimizing the distance between a mask and a photosensitive resin layer at the time of exposure.

Furthermore, the present invention intends to provide a film-type photodegradable transfer material, which can remove bad effects caused by particles included in a support film at the time of exposure.

Technical Solution

An aspect of the present invention provides a film-type photodegradable transfer material, comprising: a support film; a resin protection layer; a photodegradable photoresist layer; and a cover film, wherein the resin protection layer has an adhesion force of 0.05 $kg_f$ or less, which is defined as a force required to release a separate PET film from the resin protection layer from 5 cm off a start release point to 8 cm off a start release point, after the support film had been separated from the resin protection layer and the PET film had then been laminated on the resin protection layer.

In the film-type photodegradable transfer material, the resin protection layer may include an acrylic acid polymer having a weight average molecular weight of 5,000~300,000.

The resin protection layer may include an acrylic acid polymer having a weight average molecular weight of 5,000~300,000 and polyalkyleneglycol.

The resin protection layer may have a thickness of 0.001~10 μm.

The resin protection layer may be an alkali-developable layer.

The photodegradable photoresist layer may include an alkali-soluble resin and a diazide photosensitive compound.

The alkali-soluble resin may be a novolac resin.

The alkali-soluble resin may be a cresol novolac resin. The cresol novolac resin may have a weight average molecular weight of 2,000~30,000 (measured based on GPC). Further, the cresol novolac resin may have a mixing ratio of m-cresol and p-cresol of 4:6~6:4 by weight. Further, the cresol novolac resin may be a resin in which a cresol novolac resin having a weight average molecular weight of 8,000~30,000 (measured based on GPC) and a novolac resin having a weight average molecular weight of 2,000~8,000 (measured based on GPC) are mixed at a mixing ratio of 7:3~9:1 by weight.

The diazide photosensitive compound may include one or more selected from among 2,3,4,4'-tetrahydroxybenzophenone-1,2-naphthoquinonediazide-5-sulfonate, 2,3,4-trihydroxybenzophenone-1,2-naphthoquinonediazide-5-sulfonate, and (1-[1-(4-hydroxyphenyl)isopropyl]-4-[1,1-bis(4-hydroxyphenyl)ethyl]benzene)-1,2-naphthoquinonediazide-5-sulfonate.

The photodegradable photoresist layer may include one or more sensitivity enhancers selected from among 2,3,4-trihydroxybenzophenone, 2,3,4,4'-tetrahydroxybenzophenone, and 1-[1-(4-hydroxyphenyl)isopropyl]-4-[1,1-bis(4-hydroxyphenyl)ethyl]benzene.

The cover film may have a thickness of 15~30 μm.

Another aspect of the present invention provides a substrate for a display device on which a pattern is formed using the film-type photodegradable transfer material.

Advantageous Effects

According to the film type biodegradable transfer material of the present invention, resolution can be increased by minimizing the distance between a mask and a photosensitive resin layer at the time of exposure.

Further, according to the film-type biodegradable transfer material, the deterioration of photosensitivity attributable to the removal of a support film can be prevented, and resolution can be further improved.

Further, according to the film-type biodegradable transfer material, a support film can be separated therefrom before exposure, and work can be performed in the unit of a sheet without damaging a photoresist layer or a roll to roll process can be applied.

Furthermore, according to the film-type biodegradable transfer material, since a base layer is removed and then an exposure process is immediately performed, the exposure process can be conducted without performing a foreign body removal process, so that processes can be simplified and production costs can be reduced.

DESCRIPTION OF DRAWINGS

The above and other objects, features and advantages of the present invention will be more clearly understood from the following detailed description taken in conjunction with the accompanying drawings, in which.

DESCRIPTION OF ELEMENTS IN THE DRAWINGS

10: cover film
20: photoresist layer
30: resin protection layer
40: support film
50: flexible copper clad laminate (FCCL)
60: mask

BEST MODE

Hereinafter, preferred embodiments of the present invention will be described in detail with reference to the attached drawings.

Figure 1:
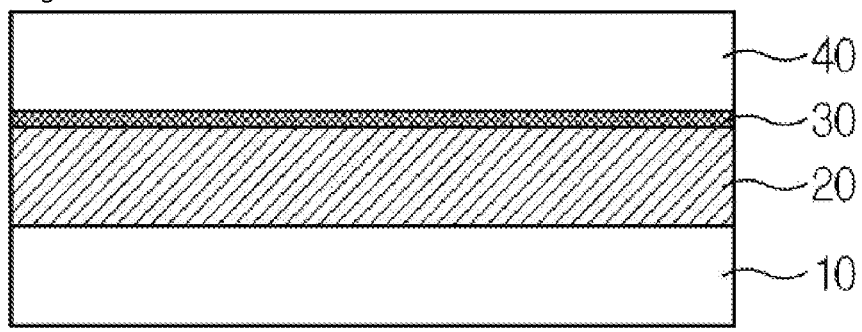
FIG. 1 is a sectional view showing a laminate structure of a film-type photosensitive transfer material according to an embodiment of the present invention.

FIG. 1 is a sectional view showing a laminate structure of a film-type photosensitive transfer material according to an embodiment of the present invention. The film-type photosensitive transfer material according to an embodiment of the present invention has a laminate structure in which a cover film 10, a photoresist layer 20, a resin protection layer 30 and a support film 40 are sequentially layered.

Figure 2:
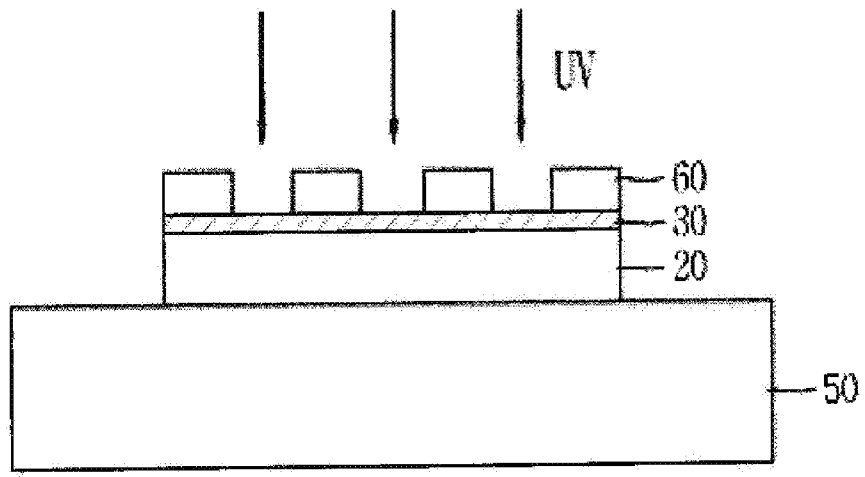
FIG. 2 is a sectional view showing a substrate for display devices, to which the film-type photosensitive transfer material is applied, at the time of exposure.

FIG. 2 is a sectional view showing a substrate for display devices, to which the film-type photosensitive transfer material is applied, at the time of exposure. When this film-type photosensitive transfer material is applied to a substrate for display devices, such as a printed circuit board, a printed wiring board or the like, a cover film 10 is removed from the film-type photosensitive transfer material, and then the film-type photosensitive transfer material from which the cover film 10 is removed is laminated on a copper clad laminate 50 such that a photoresist layer 20 is disposed on the copper clad laminate 50, and then a support film 40 is removed from the film-type photosensitive transfer material, and then a mask is placed on a resin protection layer 30, and then an exposure process and a developing process may be conducted.

After the film-type photosensitive transfer material is laminated on the copper clad laminate 50, if necessary, a prebaking process may be conducted.

The film-type photosensitive transfer material according to an embodiment of the present invention includes a resin protection layer 30 formed beneath the support film 40. Therefore, the resin protection layer 30 enables contact-type exposure even after the removal of the support film 40, and serves to improve resolution compared to the time when exposure is directly conducted on the support film 40.

For this reason, the resin protection layer 30 must be easily released from the support film 40, and must not adhere to the mask. Further, the resin protection layer 30 is required to have low adhesivity to such a degree that poor quality does not occur even when the resin protection layers are layered to each other or the copper clad laminate and resin protection layer are brought into contact with each other at the time of a sheet unit work or a roll to roll work after exposure.

In particular, when an exposure process is conducted in a state in which the resin protection layer is exposed after the support film has been separated from the resin protection layer, it is required to prevent the resin protection layer from adhering to the mask. A polyethyleneterephthalate (PET) film, a glass film or the like may be used as the mask. Therefore, the resin protection layer of the present invention is required to be easily releasable from the PET film, used as the mask for exposure, which was layered on the resin protection layer, after the support film has been separated from the resin protection layer.

For this reason, in the film-type photosensitive transfer material according to an embodiment of the present invention, it is preferred that the resin protection layer have an adhesion force of 0.05 $kg_f$ or less, which is defined as a force required to release a separate PET film from the resin protection layer from 5 cm off the start release point to 8 cm off the start release point, after the support film had been separated from the resin protection layer and the PET film had then been laminated on the resin protection layer. Specifically, the adhesion force of the resin protection layer is measured as follows. First, a protective layer is removed from a film-type photosensitive transfer material sample having a width of 3 cm and a length of 20 cm, and then the film-type photosensitive transfer material sample is laminated on a copper clad laminate at a temperature of 110° C. and a pressure of 4 $kg_f/cm^2$ at a speed of 2 m/min, and then a support film is removed from the laminated film-type photosensitive transfer material sample. Subsequently, a PET film for an exposure mask, having a width of 4 cm, a length of 25 cm and a thickness of 19 μm, is laminated on the film-type photosensitive transfer material sample from which the support film was removed at a temperature of 110° C. and a pressure of 4 kg/cm² at a speed of 2 m/min, and then the PET film for an exposure mask starts to be released from the film-type photosensitive transfer material sample, wherein the force required to release the PET film from the resin protection layer from 5 cm off the start release point to 8 cm off the start release point are measured using a universal testing machine.

Here, the PET film for an exposure mask may be a mask which is used to realize a circuit at the time of an exposure work and is made of PET.

When the adhesion force of a resin protection layer obtained by this measurement method is greater than 0.05 kg$_f$, the PET film for an exposure mask cannot be easily released from the resin protection layer, and the resin protection layer is torn, so that it is difficult to obtain advantageous effects caused by the exposure after the removal of the support film.

Meanwhile, it is preferred that the resin protection layer be removed together with the exposed photoresist layer during a developing process after the exposure process. That is, it is preferred that the resin protection layer be an alkali-developable layer. Here, the "alkali-developable layer" means a layer having a developability of 100% per 1 μm of resin protection layer thickness for 10 seconds or less when the resin protection layer is developed using tetra methyl ammonium hydroxide (TMAH) or sodium carbonate etc.

If the resin protection layer meets these requirements, the composition of the resin protection layer is not particularly limited. For example, the resin protection layer may be formed of a water-soluble polymer selected from among polyvinylether maleic anhydride, cellulose ether, carboxylalkyl cellulose, carboxylalkyl starch, polyvinyl alcohol, polyvinyl pyrrolidone, polyacrylamide, polyamide, polyacrylic acid, polyethyleneglycol, polypropyleneglycol, gelatin, ethylene oxide polymers, starch, and water-soluble salts thereof.

Particularly, in terms of stability to moisture absorption, photosensitivity and resolution, it is advantageous that the resin protection layer be formed of polyacrylic acid, that is, an acrylic acid polymer. More particularly, in consideration of stability of a protective layer and film forming ability, it is more advantageous that the resin protection layer be formed of an acrylic acid polymer having a weight average molecular weight of 5,000~300,000.

In terms of the improvement of adhesivity, the resin protection layer may include an acrylic acid polymer having a weight average molecular weight of 5,000~300,000 and polyalkyleneglycol. Here, the polyalkyleneglycol may be polyethyleneglycol, polypropyleneglycol or the like.

Meanwhile, in the case where the film-type photosensitive transfer material according to an embodiment of the present invention is used, an exposure process is performed in a state in which the film-type photosensitive transfer material is formed thereon with a resin protection layer. Therefore, in order to improve resolution, it is preferred that the thickness of the resin protection layer be thin, more preferably 0.001~10 μm.

Methods of forming this resin protection layer are not particularly limited. The resin protection layer may be formed by dissolving a composition for forming the resin protection layer in a mixed solvent of an organic solvent and water to form a mixed solution, applying the mixed solution onto a support film and then drying the applied mixed solution.

In the film-type photosensitive transfer material according to an embodiment of the present invention, the photoresist layer 20 may include an alkali-soluble resin and a diazide photosensitive compound. Specifically, the photoresist layer may be made of a novolac resin, which is an alkali-soluble resin, and more preferably a cresol novolac resin.

The novolac resin can be obtained by polycondensing only phenol or a combination of aldehyde, an acidic catalyst and a phenol.

In this case, phenols may include, but not limited to: monohydric phenols, such as phenol, o-cresol, m-cresol, p-cresol, 2,3-xylenol, 2,5-xylenol, 3,4-xylenol, 3,5-xylenol, 2,3,5-trimethylphenolxylenol, 4-t-butylphenol, 2-t-butylphenol, 3-t-butylphenol, 4-methyl-2-t-butylphenol and the like; polyhydric phenols, such as 2-naphthol, 1,3-dihydroxy naphthalene, 1,7-dihydroxy naphthalene, 1,5-dihydroxy naphthalene, resorcinol, pyrocatechol, hydroquinone, Bisphenol A, fluoroglucinol, pyrogallol and the like; and the like. They may be independently used or may be used in combinations thereof, preferably a combination of m-cresol and p-cresol.

Aldehydes may include, but are not limited to, formaldehyde, trioxane, paraformaldehyde, benzaldehyde, acetaldehyde, propylaldehyde, phenylacetaldehyde, alpha- or beta-phenylpropylaldehyde, o-, m- or phydroxybenzaldehyde, glutaraldehyde, terephthalaldehyde, and the like. They may be independently used or may be used in combinations thereof.

The cresol novolac resin may have a weight average molecular weight of 2,000~30,000 (measured based on GPC). Since the material properties, such as photosensitivity, film remaining rate and the like, of the cresol novolac resin can be changed depending on the mixing ratio of m-cresol and p-cresol, m-cresol and p-cresol may be mixed at a mixing ratio of 4:6~6:4 by weight.

When the content of m-cresol in the cresol novolac resin deviates from the above range, there is a problem in that photosensitivity increases and the film remaining rate rapidly decreases. When the content of p-cresol in the cresol novolac resin deviates from the above range, there is a problem in that photosensitivity decreases.

In the cresol novolac resin, a cresol novolac resin having a mixing ratio of m-cresol and p-cresol of 4:6~6:4 by weight may be independently used, and, more preferably, may be used together with another resin. In this case, it is preferred that a cresol novolac resin having a weight average molecular weight of 8,000~30,000 and a novolac resin having a weight average molecular weight of 2,000~8,000 be mixed at a mixing ratio of 7:3~9:1.

Here, the "weight average molecular weight" is defined as a reduced value of a polystyrene equivalent, which is determined by gel permeation chromatography (GPC).

Meanwhile, the diazide photosensitive compound included in the photoresist layer serves as a dissolution inhibitor for decreasing the solubility of an alkali-soluble resin in alkali. When the photoresist layer is irradiated with light, the diazide photosensitive compound is changed into an alkali-soluble material, so that the diazide photosensitive compound serves to decrease the solubility of an alkali-soluble resin in alkali. As such, due to the solubility change attributable to the light irradiation, the exposed site of the film-type photodegradable transfer material of the present invention is developed.

The diazide photosensitive compound can be synthesized by the esterification reaction of a polyhydroxy compound and a quinonediazide sulfonic acid compound. In the esterification reaction, the diazide photosensitive compound can be obtained by polycondensing the polyhydroxy compound and quinonediazide sulfonic acid compound using an alkaline catalyst, such as dioxane, acetone, tetrahydrofuran, methylethyl ketone, N-methylpyrrolidone, chloroform, triethylamine, N-methylmorpholine, N-methylpiperazine or 4-dimethylaminopyridine, and then washing, refining and drying the polycondensation product.

In this case, examples of the quinonediazide sulfonic acid compound may include o-quinonediazide sulfonic acid compounds, such as 1,2-benzoquinonedizide-4-sulfonic acid, 1,2-naphthoquinonediazide-4-sulfonic acid, 1,2-benzoquinonediazide-5-sulfonic acid, 1,2-naphthoquinonediazide-5-sulfonic acid and the like; and derivatives thereof.

The quinonediazide sulfonic acid compound serves as a dissolution inhibitor for decreasing the solubility of an alkali-soluble resin in alkali. However, the quinonediazide sulfonic acid compound is decomposed in order to have alkali solubility at the time of exposure, thus accelerating the dissolution of the alkali-soluble resin in alkali.

Examples of the polyhydroxy compound may include: trihydroxybenzophenones, such as 2,3,4-trihydroxybenzophenone, 2,2',3-trihydroxybenzophenone, 2,3,4'-trihydroxybenzophenone, and the like; tetrahydroxybenzophenones, such as 2,3,4,4'-tetrahydroxybenzophenone, 2,2',4,4'-tetrahydroxybenzophenone, 2,3,4,5-tetrahydroxybenzophenone, and the like; pentahydroxybenzophenones, such as 2,2',3,4,4'-pentahydroxybenzophenone, 2,2',3,4,5-pentahydroxybenzophenone, and the like; hexahydroxybenzophenones, such as 2,3,3',4,4',5'-hexahydroxybenzophenone, 2,2',3,3',4,5'-hexahydroxybenzophenone, and the like; alkyl esters of gallic acid; oxyflavones; and the like.

Specific examples of the diazide photosensitive compound may include one or more selected from among 2,3,4,4'-tetrahydroxybenzophenone-1,2-naphthoquinonediazide-5-sulfonate, 2,3,4-trihydroxybenzophenone-1,2-naphthoquinonediazide-5-sulfonate, and (1-[1-(4-hydroxyphenyl)isopropyl]-4-[1,1-bis(4-hydroxyphenyl)ethyl]benzene)-1,2-naphthoquinonediazide-5-sulfonate.

It is advantageous in terms of developability and dissolubility that the amount of the diazide photosensitive compound included in the photoresist layer be 30~80 parts by weight based on 100 parts by weight of the alkali-soluble resin.

Meanwhile, in the film-type photosensitive transfer material according to an embodiment of the present invention, the photoresist layer may further include a sensitivity enhancer in order to improve its sensitivity. The sensitivity enhancer may be one or more selected from among 2,3,4-trihydroxybenzophenone, 2,3,4,4'-tetrahydroxybenzophenone, and 1-[1-(4-hydroxyphenyl)isopropyl]-4-[1,1-bis(4-hydroxyphenyl)ethyl]benzene.

It is advantageous in terms of photosensitivity improvement and window process margin that the amount of the sensitivity enhancer included in the photoresist layer be 3~15 parts by weight based on 100 parts by weight of the alkali-soluble resin.

Besides, the photoresist layer may further include a leveling agent, a filler, an antioxidant, and other components or additives.

Meanwhile, the composition including the alkali-soluble resin, the diazide photosensitive compound and the like is dispersed in a solvent to form a solution, and then the solution is applied onto a substrate. In this case, the solvent may be one or more selected from the group consisting of ethyl acetate, butyl acetate, ethyleneglycol monoethylether acetate, diethyleneglycol monoethylether acetate, propyleneglycol monoethylether acetate, acetone, methylethyl ketone, ethyl alcohol, methyl alcohol, propyl alcohol, isopropyl alcohol, benzene, toluene, cyclopentanone, cyclohexanone, ethyleneglycol, xylene, ethyleneglycol monoethylether, and diethyleneglycol monoethylether.

Meanwhile, in the film-type photosensitive transfer material according to an embodiment of the present invention, the support film 40 must have material properties suitable for a positive-type dry film photoresist. Examples of the support film 40 may include, but not limited to, a polycarbonate film, a polyethylene (PE) film, a polypropylene (PP) film, an oriented polypropylene (OPP) film, a polyethylene terephthalate (PET) film, a polyethylene naphthalate (PEN) film, an ethylene vinyl acetate (EVA) film, a polyvinyl film, other suitable polyolefin films, an epoxy film, and the like. In particular, it is preferred that the polyolefin films include a polypropylene (PP) film, a polyethylene (PE) film, an ethylene vinyl acetate (EVA) film, and the like. It is preferred that the polyvinyl film include a polyvinyl chloride (PVC) film, a polyvinyl acetate (PVA) film, a polyvinyl alcohol (PVOH) film, and the like. It is preferred that the polystyrene film include a polystyrene (PS) film, an acrylonitrile-butadiene-styrene (ABS) film, and the like. In particular, the support film 40 may be transparent to such a degree that light can be applied to the photoresist layer therethrough. The support film 40 may have a thickness of about 10~50 μm, preferably about 15~50 μm, and more preferably about 15~25 μm such that it serves as a framework for supporting the shape of a positive-type dry film photoresist.

Moreover, the film-type photosensitive transfer material according to an embodiment of the present invention may further include a cover film 10 on the other side of the photoresist layer 20. This cover film 10 serves to block air and to protect the photoresist layer 10 from foreign bodies. The cover film 10 may be formed of a polyethylene film, a polyethylene terephthalate film, a polypropylene film or the like. Further, the cover film 10 may have a thickness of 15~30 μm.

Meanwhile, methods of manufacturing a film-type photodegradable transfer material according to an embodiment of the present invention are not particularly limited. For example, there is a method of manufacturing a film-type photodegradable transfer material, comprising: applying a composition for forming a resin protection layer 30 onto a support film 40 and then drying the composition to form the resin protection layer 30; mixing a composition including an alkali-soluble resin and a diazide photosensitive compound with a predetermined amount of solvent to form a mixed solution and the applying the mixed solution onto the resin protection layer 30 to form a photoresist layer 20; and applying a cover film 10 onto the photoresist layer 20. Further, there is another method of manufacturing a film-type photodegradable transfer material, comprising: forming a resin protection layer 30 on a support film 40; forming a photoresist layer 20 on a cover film 10; and bonding the resin protection layer 30 with the photoresist layer 20 such that they face each other. Here, methods of applying the composition for forming the resin protection layer onto the support film or applying the mixed solution for forming the photoresist layer onto the resin protection layer may include, but are not limited to, a roll coating method, a Meyer rod coating method, a gravure printing method, a spray coating method, and the like. In these methods, the compositions applied on the respective films are dried, so that solvent is removed therefrom, thereby forming the respective layers. If necessary, the applied compositions may be heated and cured.

Meanwhile, a method of forming a pattern using a photoresist resin film according to the present invention comprises the steps of: (I) forming a dry film photoresist on a glass substrate such that a photoresist layer of the dry film photoresist layer faces the glass substrate and simultaneously separating a support film from the photoresist layer; (II) irradiating the dry film photoresist with UV through a mask or directly; and (III) removing a resin protection layer and the irradiated photoresist layer through a developing process to form a patterned resist film.

In step (I), a photoresist layer of a positive-type dry film photoresist adheres onto a glass substrate such that they face each other, thus forming a positive-type photoresist resin film. In this case, a support film is separated from the positive-type dry film photoresist such that a resin protection layer appears on the surface of the positive-type dry film photoresist.

If necessary, a baking process may be further conducted before or after step (II) in order to increase the adhesion between the patterned resist film and the substrate such that the patterned resist film is not washed out when the developing process is performed in step (III).

More specifically, before step (II), a positive-type photoresist resin film is formed on a substrate, and then a support film is separated from the positive-type photoresist resin film, and then a baking process may be performed in order to increase the adhesion between the positive-type photoresist resin film and the substrate. Further, after step (II), the support film is separated from the positive-type photoresist resin film, and then the baking process may be performed in order to increase the adhesion between the positive-type photoresist resin film and the substrate. Furthermore, the support film is separated from the positive-type photoresist resin film, and then the separated photoresist resin film is baked to increase the adhesion between the positive-type photoresist resin film and the substrate. That is, the baking process can be repetitively performed depending on the requirements of the positive-type photoresist resin film, the complexity of a solvent system and the difference of boiling point.

As described above, through the steps (I), (II) and (III), a desired patterned resist film is formed.

As a developer for developing the positive-type photoresist resin film of the present invention, 2.38% of tetramethylammonium hydroxide (TMAH) may be used.

MODE FOR INVENTION

Hereinafter, the present invention will be described in more detail with reference to the following Examples. However, the scope of the present invention is not limited to the following Examples.

Examples 1 to 3

(a) An acrylic acid polymer having a weight average molecular weight of 70,000 and a solid content of 40% was prepared by polymerizing methacrylic acid, methylmethacrylate (MMA) and styrene, which are mixed with each other at a mixing ratio of 20:70:10 by weight, under the condition that methylethyl ketone (MEK) is used as a solvent, 1% of azobisisobutyronitrile (AIBN) is used as a polymerization initiator, reaction temperature is 80° C., reaction time is 4 hours and 3% of azobisisobutyronitrile (AIBN) is used as a post-initiator.

(b) The acrylic acid polymer was mixed with PEG 400 and MEK, given in Table I, and then stirred using a mechanical stirrer to obtain a composition for a resin protection layer. Subsequently, the composition for a resin protection layer was applied onto a support film (PET) having a thickness of 19 μm using a coating bar and then dried at a temperature of 80° C. for 10 minutes using a hot air oven to form a resin protection layer having a thickness of 2 μm.

(c) A solution including: a cresol novolac resin, as an alkali-soluble resin, in which the mixing ratio of m-cresol and p-cresol is 4:6 by weight, and a cresol novolac resin having a weight average molecular weight of 8,000 and a novolac resin having a weight average molecular weight of 2,000 are mixed at a mixing ratio of 7:3 by weight; 34 parts by weight of 2,3,4-trihydroxybenzophenone-1,2-naphthoquinonediazide-5-sulfonate, as a photosensitive compound, based on 100 parts by weight of the alkali-soluble resin; 3.6 parts by weight of 2,3,4-trihydroxybenzophenone, as a sensitivity enhancer; 165 parts by weight of methylethyl ketone, as a low boiling point solvent; and 0.5 parts by weight of a fluorine-containing silicon resin, as a release agent was prepared. The prepared solution was filtered using a millipore Teflon filter having a pore size of 0.2 μm to remove insolubles therefrom, thereby preparing a solution for forming a photoresist layer.

(d) The solution for forming a photoresist layer was applied onto the resin protection layer formed in step (b) using a coating bar, and was then dried at a temperature of 80° C. for 6 minutes using a hot air oven to form a photoresist layer having a thickness of 5 μm. Subsequently, the photoresist layer was coated with a polyethylene film having a thickness of 23 μm to protect a photosensitive resin composition included in the photoresist layer, thereby manufacturing a film-type photosensitive transfer material.

TABLE 1

|  | Example 1 | Example 2 | Example 3 |
|---|---|---|---|
| Acrylic acid polymer | 20 g | 20 g | 20 g |
| PEG 400 | — | 3 g | 6 g |
| MEK (solvent) | 40 g | 40 g | 40 g |

* PEG 400(Polyethyleneglycol): Sigma-Aldrich, average molecular weight 400

Comparative Example 1

A solution including: a cresol novolac resin, as an alkali-soluble resin, in which the mixing ratio of m-cresol and p-cresol is 4:6 by weight, and a cresol novolac resin having a weight average molecular weight of 8,000 and a novolac resin having a weight average molecular weight of 2,000 are mixed at a mixing ratio of 7:3 by weight; 34 parts by weight of 2,3,4-trihydroxybenzophenone-1,2-naphthoquinonediazide-5-sulfonate, as a photosensitive compound, based on 100 parts by weight of the alkali-soluble resin; 3.6 parts by weight of 2,3,4-trihydroxybenzophenone, as a sensitivity enhancer; 165 parts by weight of methylethyl ketone, as a low boiling point solvent; and 0.5 parts by weight of a fluorine-containing silicon resin, as a release agent was prepared. The prepared solution was filtered using a millipore Teflon filter having a pore size of 0.2 μm to remove insolubles therefrom. The filtered solution was applied onto a polyethylene terephthalate (PET) film (thickness: 19 μm) to a thickness of 5 μm to form a photoresist resin layer. The photoresist resin layer was coated with a polyethylene film protection layer having a thickness of 23 μm to manufacture a positive-type photoresist resin film.

The above-obtained positive-type photoresist resin film was evaluated as follows.
(1) Release Force
<Cover Film>
A force required to release a cover film from a film-type photosensitive transfer material sample having a width of 3 cm and a length of 20 cm from 5 cm off a start release point to 8 cm off a start release point while the cover film is released from the film-type photosensitive transfer material was measured using a universal testing machine (UTM, 4303 series, manufactured by Instron Corp.).

<Support Film>
A cover film was removed from a film-type photosensitive transfer material sample having a width of 3 cm and a length of 20 cm, and then the film-type photosensitive transfer material sample was laminated on a copper clad laminate under the conditions of a temperature of 110° C., a speed of 2 m/min and a pressure of 4 kg$_f$/cm$^2$. Subsequently, a force required to release a support film from the film-type photosensitive transfer material sample from 5 cm off a start release point to 8 cm off a start release point while the support film is released from the film-type photosensitive transfer material was measured using a universal testing machine (UTM, 4303 series, manufactured by Instron Corp.).

(2) Adhesion Force

A cover film was removed from a film-type photosensitive transfer material sample having a width of 3 cm and a length of 20 cm, and then the film-type photosensitive transfer material sample was laminated on a copper clad laminate under the conditions of a temperature of 110° C., a speed of 2 m/min and a pressure of 4 kg$_f$/cm$^2$, and then a support film was removed therefrom. Subsequently, a PET film (FDFR, manufactured by Kolon Industries Inc.) having a width of 4 cm, a length of 25 cm and a thickness of 19 μm was laminated thereon under the conditions of a temperature of 110° C., a speed of 2 m/min and a pressure of 4 kg$_f$/cm$^2$, and then a force required to release the PET film from the film-type photosensitive transfer material sample from 5 cm off a start release point to 8 cm off a start release point was measured using a universal testing machine (UTM, 4303 series, manufactured by Instron Corp.).

The conditions required to laminate the PET film are the same as those required to attach the PET film to a mask at the time of exposure. In Examples 1, 2 and 3, the adhesion force measured in this way is the adhesion force between the resin protection layer and the PET film.

TABLE 2

| | Release force (kg$_f$) | | Adhesion force (kg$_f$) Resin protection layer-mask (PET) film |
|---|---|---|---|
| | Cover film | Support film | |
| Example 1 | 0.0039 | 0.0123 | 0.0001 |
| Example 2 | 0.0037 | 0.0067 | 0.0005 |
| Example 3 | 0.0038 | 0.0044 | 0.0035 |
| Comp. Example 1 | 0.0031 | 0.0234 | non |

From the measurement results thereof, it can be seen that both the release force between the photosensitive resin layer and the cover film and the release force between the resin protection layer and the support film are present in the range in which workability does not deteriorate, that the adhesion force between the resin protection layer of each Example and the mask commonly used in an exposure condition is very low, and thus that the film-type photosensitive transfer material of the present invention is easy to treat. Further, it can be seen that the adhesion force between the resin protection layer and the mask is increased with the increase in the amount of PEG 400.

Thereafter, the positive-type photoresist films of Examples 1 to 3 and Comparative Example were respectively laminated on a substrate under the conditions of a lamination speed of 0.5~3.5 m/min, a temperature of 100~130° C. and a rolling pressure of 10~90 psi. However, in the case of the positive-type photoresist film of Comparative Example, the lamination process thereof was performed after a process of separating the cover film was previously performed.

Subsequently, the laminated positive-type photoresist film was irradiated with (exposed to) UV, and then the support film is separated therefrom. Then, the exposed positive-type photoresist film was developed in 2.38 wt % of an alkaline developer (TMAH) for 60 seconds to form a fine pattern. However, the positive-type photoresist films of Examples 1 to 3, each of which includes a resin protection layer, were developed for 64 seconds to develop the resin protection layer and the exposed photoresist layer.

At the time of exposure, in the case of the positive-type photoresist films of each of Examples 1 to 3, exposing was conducted onto the resin protection layer after the support film is separated therefrom. In the case of the positive-type photoresist film of Comparative Example, exposing was conducted both onto the support film and the photoresist layer after the support film was separated therefrom. The material properties of the formed pattern were measured as follows, and the results thereof are given in Table 3.

(1) Sensitivity Evaluation

The manufactured positive-type photoresist films were exposed using a contact-type exposure device according to exposure amount, were developed in 2.38 wt % of an aqueous TMAH solution for 60 seconds (in the case of Examples 1 to 3, developed for 64 seconds), were water-washed for 30 seconds and then dried, and then the exposure amounts required to form a fine pattern of Line/Space of 1/1 were measured. In this case, the size of the fine pattern was observed through an optical microscope.

(2) Resolution Evaluation

Meanwhile, the non-exposed site remaining after the development was formed into a pattern. In this case, resolution was observed through an optical microscope.

TABLE 3

| | | Sensitivity (mJ/cm$^2$) | Resolution (um) |
|---|---|---|---|
| Example 1 | | 60.7 | 4.8 |
| Example 2 | | 60.6 | 4.7 |
| Example 3 | | 60.7 | 4.8 |
| Comp. Example 1 | Exposure after the separation of support film | 59.7 | 4.5 |
| | Exposure onto support film | 62.9 | 5.5 |

From the results of Table 3, it can be seen that the exposure amounts required to realize a circuit in the case of Examples 1 to 3 are smaller than that required to realize a circuit in the case of Comparative Example in which a support film is exposed using a photoresist film, and that the resolutions in the case of Examples 1 to 3 are higher than that in the case of Comparative Example. However, in the case of Comparative Example in which a photolithography process is performed using the photoresist film after the support film is separated, exposure amount and resolution are excellent, but there is a problem in that a contact-type exposure device adheres to a photoresist layer. Further, it can be seen that the exposure amounts required to realize a circuit in the case of Examples 1 to 3 are smaller than that required to realize a circuit in the case of Comparative Example in which a photoresist film is exposed after the support film is separated, and that the resolutions in the case of Examples 1 to 3 are equal to that in the case of Comparative Example.

The invention claimed is:

1. A film-type photodegradable transfer material, comprising: a support film; a resin protection layer; a photodegradable photoresist layer; and a cover film, wherein the resin protection layer comprises an acrylic acid polymer and 15 to 30 parts by weight of polyethylene glycol based on 100 parts by weight of the acrylic acid polymer, said acrylic acid polymer having a weight average molecular weight of 5,000~300,000; and wherein the resin protection layer has an adhesion force of 0.05 kg$_f$ or less, which is defined as a force required to release a separate polyethyleneterephthalate film from the resin protection layer from 5 cm off a start release point to 8 cm off a start release point, after the support film is separated from the resin protection layer and the polyethyleneterephthalate film is laminated on the resin protection layer.

2. The film-type photodegradable transfer material according to claim 1, wherein the resin protection layer has a thickness of 0.001~10 μm.

3. The film-type photodegradable transfer material according to claim 1, wherein the resin protection layer is an alkali-developable layer.

4. The film-type photodegradable transfer material according to claim 1, wherein the photodegradable photoresist layer includes an alkali-soluble resin and a diazide photosensitive compound.

5. The film-type photodegradable transfer material according to claim 4, wherein the alkali-soluble resin is a novolac resin.

6. The film-type photodegradable transfer material according to claim 4, wherein the alkali-soluble resin is a cresol novolac resin.

7. The film-type photodegradable transfer material according to claim 6, wherein the cresol novolac resin has a weight average molecular weight of 2,000~30,000, measured by gel permeation chromatography.

8. The film-type photodegradable transfer material according to claim 7, wherein the cresol novolac resin has a mixing ratio of m-cresol and p-cresol of 4:6~6:4 by weight.

9. The film-type photodegradable transfer material according to claim 8, wherein the cresol novolac resin is a resin in which a cresol novolac resin having a weight average molecular weight of 8,000~30,000, measured by gel permeation chromatography, and a novolac resin having a weight average molecular weight of 2,000~8,000, measured by gel permeation chromatography, are mixed at a mixing ratio of 7:3~9:1 by weight.

10. The film-type photodegradable transfer material according to claim 4, wherein the diazide photosensitive compound includes one or more selected from among 2,3,4,4'-tetrahydroxybenzophenone-1,2-naphthoquinonediazide-5-sulfonate, 2,3,4-trihydroxybenzophenone-1,2-naphthoquinonediazide-5-sulfonate, and (1-[1-(4-hydroxyphenyl)isopropyl]-4-[1,1-bis(4-hydroxyphenyl)ethyl]benzene)-1,2-naphthoquinonediazide-5-sulfonate.

11. The film-type photodegradable transfer material according to claim 1, wherein the photodegradable photoresist layer includes one or more sensitivity enhancers selected from among 2,3,4-trihydroxybenzophenone, 2,3,4,4'-tetrahydroxybenzophenone, and 1-[1-(4-hydroxyphenyl)isopropyl]-4-[1,1-bis(4-hydroxyphenyl)ethyl]benzene.

12. The film-type photodegradable transfer material according to claim 1, wherein the cover film has a thickness of 15~30 μm.

13. The film-type photodegradable transfer material according to claim 2, wherein the resin protection layer is an alkali-developable layer.

14. The film-type photodegradable transfer material according to claim 2, wherein the photodegradable photoresist layer includes an alkali-soluble resin and a diazide photosensitive compound.

15. The film-type photodegradable transfer material according to claim 14, wherein the alkali-soluble resin is a novolac resin.

16. The film-type photodegradable transfer material according to claim 14, wherein the alkali-soluble resin is a cresol novolac resin.

17. The film-type photodegradable transfer material according to claim 16, wherein the cresol novolac resin has a weight average molecular weight of 2,000 30,000, measured by gel permeation chromatography.

18. The film-type photodegradable transfer material according to claim 17, wherein the cresol novolac resin has a mixing ratio of m-cresol and p-cresol of 4:6~6:4 by weight.

19. The film-type photodegradable transfer material according to claim 18, wherein the cresol novolac resin is a resin in which a cresol novolac resin having a weight average molecular weight of 8,000~30,000, measured by gel permeation chromatography, and a novolac resin having a weight average molecular weight of 2,000~8,000, measured by gel permeation chromatography, are mixed at a mixing ratio of 7:3~9:1 by weight.

20. The film-type photodegradable transfer material according to claim 14, wherein the diazide photosensitive compound includes one or more selected from among 2,3,4,4'-tetrahydroxybenzophenone-1,2-naphthoquinonediazide-5-sulfonate, 2,3,4-trihydroxybenzophenone-1,2-naphthoquinonediazide-5-sulfonate, and (1-[1-(4-hydroxyphenyl)isopropyl]-4-[1,1-bis(4-hydroxyphenyl)ethyl]benzene)-1,2-naphthoquinonediazide-5-sulfonate.

21. The film-type photodegradable transfer material according to claim 2, wherein the photodegradable photoresist layer includes one or more sensitivity enhancers selected from among 2,3,4-trihydroxybenzophenone, 2,3,4,4'-tetrahydroxybenzophenone, and 1-[1-(4-hydroxyphenyl)isopropyl]-4-[1,1-bis(4-hydroxyphenyl)ethyl]benzene.

22. The film-type photodegradable transfer material according to claim 2, wherein the cover film has a thickness of 15~30 μm.

\* \* \* \* \*